PURE FLUID OPERATIONAL AMPLIFIER
Filed Nov. 30, 1964 2 Sheets-Sheet 1
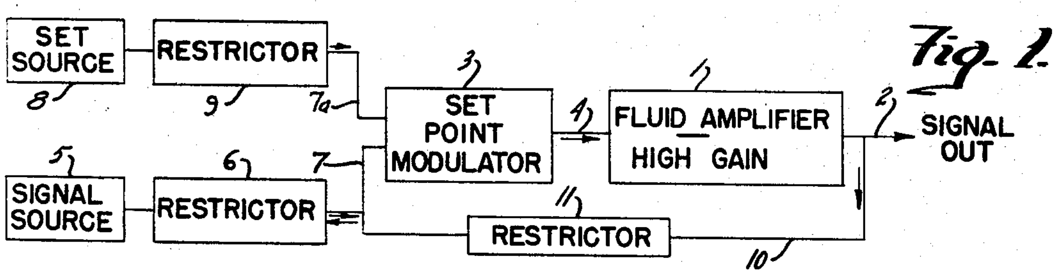
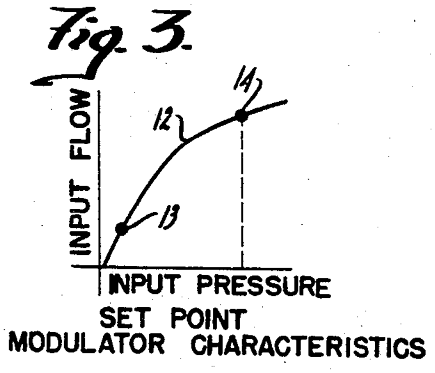
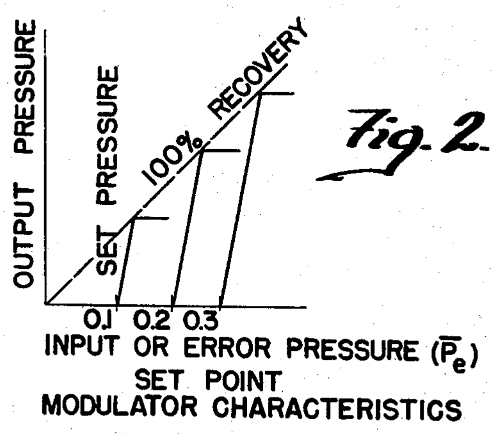
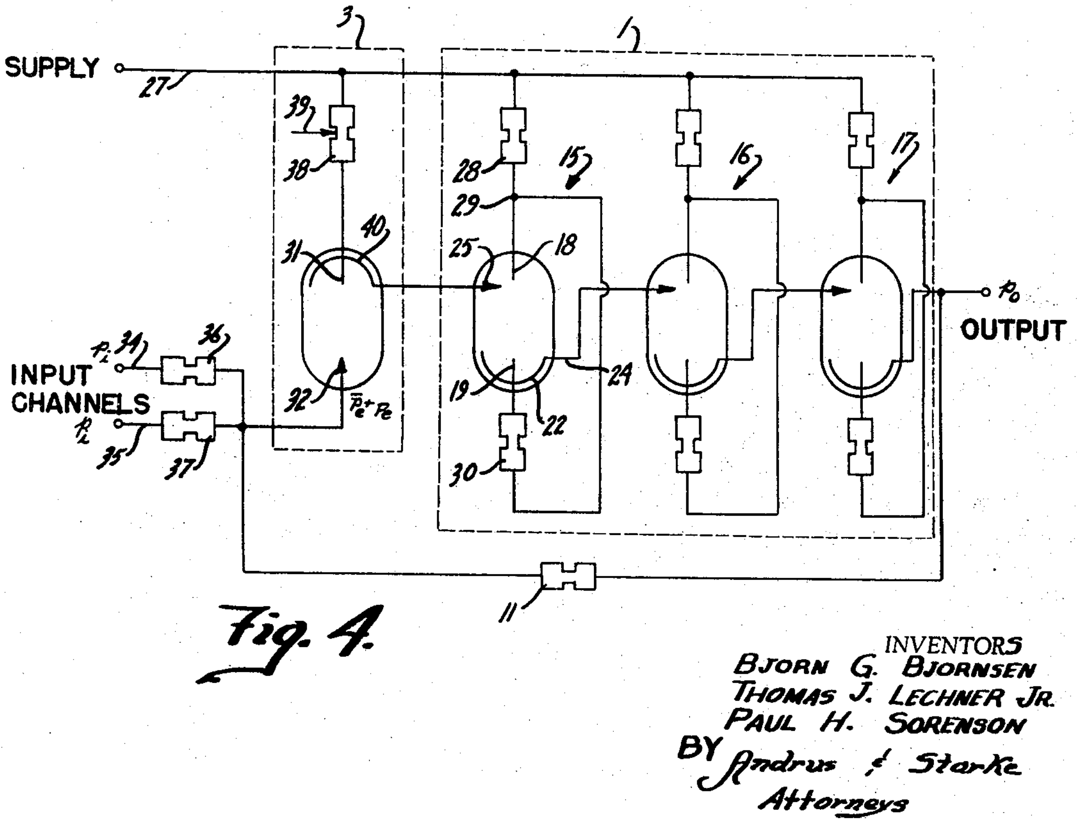
INVENTORS
BJORN G. BJORNSEN
THOMAS J. LECHNER JR.
PAUL H. SORENSON
BY Andrus & Starke
Attorneys INVENTORS
BJORN G. BJORNSEN
THOMAS J. LECHNER JR
PAUL H SORENSON
BY Andrus & Starke
Attorneys

1

3,417,769
PURE FLUID OPERATIONAL AMPLIFIER

Bjorn G. Bjornsen, Milwaukee, Thomas J. Lechner, Jr., Menomonee Falls, and Paul H. Sorenson, West Allis, Wis., assignors to Johnson Service Company, Milwaukee, Wis., a corporation of Wisconsin Filed Nov. 30, 1964, Ser. No. 414,808
9 Claims. (Cl. 137—81.5)

ABSTRACT OF THE DISCLOSURE

A set point impact modulator forms the input to a high gain fluid amplifier forming a part of a pure fluid operational amplifier. The set impact modulator includes a pair of opposed nozzles. A first nozzle is connected to a supply through an adjustable restrictor and the second nozzle is connected to the input signals through restrictors. A feedback restrictor connects the output of the pure fluid amplifier to the second nozzle and the flows and signals at the second nozzle are the summation of the input signals and the feedback signal which is the total or net error signal. The set point modulator through the adjustable restrictor connected to the first nozzle provides adjustment of the zero signal level such that the error pressure signal is biased to a raised level such that both positive and negative feedback can be provided.

This invention relates to a pure fluid operational amplifier and particularly to such an amplifier providing a linear output which may be accurately predicted based on design parameters.

Fluid operating systems of a pure fluid variety have recently been developed in which the total energy of a fluid stream or streams delivered to a utilization device is directly controlled by other fluid streams without the interposition of mechanical or similar moving parts.

In the design of pure fluid systems, linear amplification and multiplication of one or more signals by a constant may be required. In electrical devices, operational amplifiers perform such a function. The design of a similar pneumatic operational amplifier requiring a very high forward gain with a suitable fluid feedback system interconnected to provide similar functions is complicated by the many amplifying stages required of most designs and is particularly plagued with low input fluid impedance.

Thus, pure fluid amplifying devices, in contrast to apparently similar electronic devices, do not generally have a practical infinite input impedance but rather generally require an input flow of noticeable magnitude.

A highly satisfactory high gain pure fluid modulator amplifier is disclosed in the copending application of Bjornsen and Lechner entitled; Fluid Control Apparatus, filed Nov. 1, 1963, with Ser. No. 320,680, now Patent No. 3,272,215 and assigned to the same assignee as the present application. Generally, in accordance with the disclosure of that application, a pair of opposed and impacting streams interact and by means of a collector orifice provide an output signal directly proportional to the relative strength of the impacting streams. This modulation provides a very sensitive, pure fluid amplifier having a high gain. As also disclosed in that application, the high gain characteristic of the amplifier particularly adapts the unit to providing a pure fluid amplifier employing a feedback signal.

The present invention is based on the concept of high gain forward amplification using negative feedback to attain a desired linear amplification. A special application of the impact modulator or the like is used to realize the present invention which hereafter is referred to as set point modulator. Because the input impedance of the

2 high gain amplification stage depends in a nonlinear fashion on the input sigal level, the set point modulator biases the error pressure signal to a level where the input impedance is not only high, but also less sensitive to pressure changes. Generally, in accordance with a most important aspect of the present invention, the set point modulator performs this function in accordance with the teaching of the previously identified application having a pair of opposed impacting streams one of which is modulated in accordance with one or more signal inputs and the other a set point control pressure means with the output of the set point modulator connected to the input of the high gain, pure fluid amplifier stage with the result that the effective input fluid impedance is relatively high and remains relatively constant.

The present invention may be carried out employing transverse impact modulators with suitable summing and feedback restrictors. Interposed between the input restrictors and the amplifier input is a set point impact modulator having one side connected to the summing restrictors and the opposite side connected to a set point adjustment pressure source. The output of the set adjustment source provides the selected increased operating pressure to the high gain proportional amplifier such that it operates on a portion of relatively constant slope on the pressure-flow curve. The feedback signal restrictor is connected between the output of the high gain proportional amplifier and the input side of the set point modulator connected to the summing restrictors. It has been found that with this device, the output of the operational amplifier can be very closely and reliably predicted based on the ratio of the effective fluid impedance of the input restrictors and the feedback restrictors. In effect, the present invention eliminates the effect of the actual flow as a part of the input of a pure fluid amplifier and provides a true operational fluid amplifier.

The present invention thus provides a pure fluid operational amplifier which can be used for summing and amplification of pressures providing highly predictable output results.

The drawings furnished herewith illustrate a preferred design of the present invention clearly disclosing the features and advantages heretofore discussed as well as others which will be clear to those skilled in the art.

In the drawings:

FIG. 1 is a block diagram illustrating the present invention;

FIG. 2 is a set of typical curves for a set point modulator such as employed in FIG. 1 operating at different set point pressures;

FIG. 3 is a typical input flow versus input pressure curve showing the operating point of the set point modulator;

FIG. 4 is a schematic circuit or hosing diagram of a preferred construction of the present invention;

Figure 5:
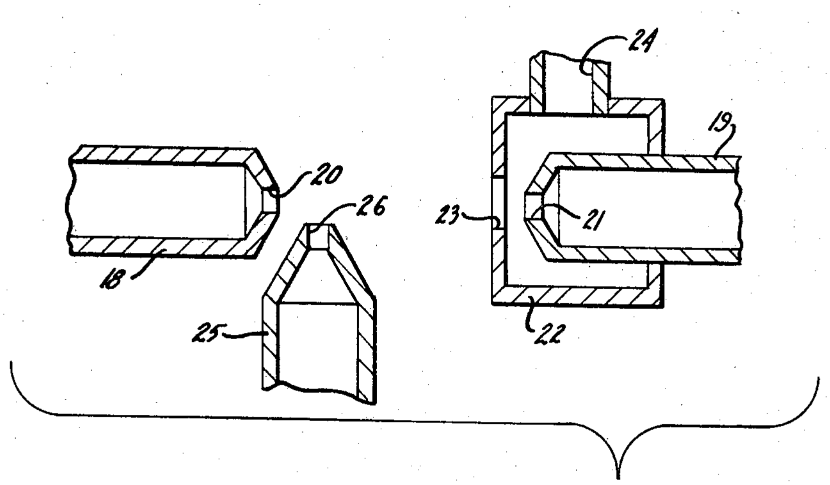
FIG. 5 is a diagrammatic physical diagram of an impact modulator shown schematically in FIG. 4.

Referring to the drawings and particularly to FIG. 1, a block diagram of a pure fluid operational amplifier is shown, constructed in accordance with the present invention.

In FIG. 1, a pure fluid amplifier 1 having a high gain is connected to an output line 2 at which the output flow and pressure appears and which is connected to a suitable utilization device, not shown. A set point modulator 3 interconnects an input line 4 of the amplifier 1 to a fluid signal source 5 in series with a restrictor 6 having a selected fluid resistance or pressure drop. The effective opposition to flow or fluid resistance of the restrictors is constant and equal to the pressure drop over the flow. In accordance with the present invention, the modulator 3 includes a signal line 7 connected to restrictor 6 and a set point input line 7$a$ which is connected to pressure source 8 in series with a suitable restrictor 9 to increase the operating point of the system, as hereinafter discussed and produces a truly linear operational amplifier. The modulator 3 is a fluid impact device as disclosed in the previously referred to copending application and shown schematically and diagrammatically in FIGS. 4 and 5 herein. To complete the operational amplifier system, the output line 2 is connected to the common input line 7 of modulator 3 by a feedback line 10 having a feedback restrictor 11 therein of a given fluid impedance.

Referring particularly to the characteristics of FIG. 2, representative of a typical set point modulator, the error pressure ($\overline{P}_e$) is compared to different fixed pressure (set point) with the result of biasing the input to a higher level. As clearly shown therein, the output pressure will not increase until the error pressure overcomes the set point pressure. The major advantage of this scheme is to allow the error signal to operate into a higher input impedance.

Referring particularly to FIG. 3, a typical input pressure and flow relationship of the set point modulator 3 is shown with the input flow along the vertical axis and the input pressure along the horizontal axis. Assuming the fluid amplifier 1 has a sufficiently high gain, the change in the input pressure for a given change in output pressure is practically zero. As a result, the fluid impedance or resistance of the device corresponds to the reciprocal of the slope of the pressure-flow curve 12 of FIG. 3 evaluated at the selected operating pressure; i.e. operated at the pressure wherein an output corresponding to a selected zero pressure level is obtained. In FIG. 3, the slope or the reciprocal of impedance increases as the operating pressure point approaches zero. The input impedance also approaches zero and prevents the device from operating as a true operational amplifier; for example, at point 13. However, at an elevated pressure point 14, the slope decreases and provides a means to increase the input impedance. Generally, the shape of the curve of FIG. 3 defines the flow Q as equal to a constant $k$ times the square root of the pressure P. The constant is related to the signal orifice geometry, namely the diameter squared.

Thus, for small signals the input impedance $r=d^P/d^Q$ at the operating pressure and is therefore approximately $2\sqrt{P}$ divided by the constant $k$.

In order to facilitate both positive and negative signals a pressure in the middle of the output range is arbitrarily selected to represent a zero signal. For example, if the output range were zero to ten p.s.i.g. (pounds per square inch gauge), then five p.s.i.g. could represent zero signal, zero p.s.i.g. a minus five p.s.i. signal, and ten p.s.i.g. a plus five p.s.i. signal. This convention has been adapted for both the input and the output. With this convention in mind, the set pressure of the set point modulator is adjusted so that with a zero signal on all inputs, the output will be at a zero output signal. The valve of this error pressure is then designated as the static or zero signal error pressure ($\overline{P}_e$).

The total flow into the set point modulator ($Q_e$) results from the zero signal error pressure ($\overline{P}_e$) and the signal pressure ($p_e$), such that $$Q_e=k\sqrt{\overline{P}_e}+\frac{p_e}{r}\text{ where }\frac{p_e}{\overline{P}_e}\ll 1$$

where $$k\sqrt{\overline{P}_e}$$

is the zero signal flow, and $p_e/r$ is the signal flow. By summing of all flows into the set point modulator, the static or zero signal equation can be written as $$k\sqrt{\overline{P}_e}=G_T(P_L-\overline{P}_e)$$

where $$G_T=\sum_{i=1}^{n}\frac{1}{R_i}+\frac{1}{R_f}$$

$n$ is the total number of inputs $P_L$ is the pressure level that represents zero signal (in the example above $P_L=5$ p.s.i.g.)

$\overline{P}_e$ is the zero signal error pressure $R_i$ is the impedance of the various inputs ($n$ in all)

$R_f$ is the feedback impedance

The small signal equation becomes $$p_o=\sum_{i=1}^{n}\frac{-\left(\frac{R_f}{R_i}\right)p_i}{1+\frac{R_f}{K_o}\left(G_T+\frac{1}{r}\right)}$$

where $p_i$ is the input signal pressure in p.s.i.g.

In order for the closed loop gain $p_o/p_i$ ($p_o$=output signal pressure) of the system to be equal to the fluid impedance ratio $R_f/R_i$; the denominator must be equal to one and consequently the second portion thereof must be equal to zero. If this expression is small but not zero, its value is substantially the error ($\epsilon$) in gain prediction. The equation can be written:

$$\epsilon=\frac{1}{K_o}\left(1+K_T+\frac{R_f k}{2\sqrt{\overline{P}_e}}\right)$$

where $K_o$=the forward gain $K_T$=sum of the input gains $$\left(\frac{R_f}{R_1}+\frac{R_f}{R_2}+\dots\frac{R_f}{R_n}\right)$$

$R_f$=fluid feedback impedance or resistance $k$=constant related to the input orifice geometry $\overline{P}_e$=zero signal error pressure Generally, if $K_o$, the forward gain, is made much greater than one plus the sum of the closed loop gains, the first two terms can be eliminated and the error equation reduces to $$=\frac{R_f k}{2\sqrt{\overline{P}_e}K_o}$$

Generally $R_f$ cannot be controlled and the error can only be minimized by making $k$ small. As previously noted, $k$ is made small by employing a small orifice. Generally, the zero signal error pressure which is the only remaining factor, cannot be raised significantly because the high forward gain usually does not allow much biasing. Thus, generally $\overline{P}_e$ will be a small part of a p.s.i.g.

The present invention however particularly teaches through the application of the unique set point modulator 3 how the error signal $\overline{P}_e$ can be substantially increased to a level to increase the input impedance such that the feedback to input impedance ratio predicts the actual gain of the operational amplifier. Further, the set point modulator 3, not only increases the input impedance, but provides additional gain and serves as an internal amplifier set point control.

The embodiment of the invention shown in FIG. 1 and the above description of FIGS. 1–3 illustrates the basic concepts employed in the present invention. An actual operational amplifier based on the principles of the present invention is schematically shown in FIG. 4 with the structure of the active elements diagrammatically shown in FIG. 5. The elements of FIG. 4 corresponding to FIG. 1 are similarly numbered for purposes of clarity and simplicity of description.

In the embodiment of FIG. 4, the high gain amplifier 1 includes three stages of amplification 15, 16 and 17, each stage being a transverse impact amplifier generally constructed in accordance with the teachings of applicants' copending application and diagrammatically shown in FIG. 5. Referring particularly to FIG. 5, each stage includes a pair of emitting or main stream nozzles 18 and 19 having similar orifices 20 and 21 which are mounted in opposed spaced relationship and generate a pair of impacting streams. A collector chamber 22 encloses the end of nozzle 19 and is provided with a control orifice 23 aligned with the orifices 20 and 21 and an output 24. The point of the impact of the streams from nozzles 18 and 19 is generally within the control orifice 23 of the collector chamber 22. The output is therefore dependent upon the relative opposed strengths of the two impacting streams at the position of impact. The control signal is applied through a control nozzle 25 having an orifice 26 disposed between nozzles 18 and 19 and extending perpendicularly to the path of the main streams and adjacent the emitting nozzle 18. The stream from the nozzle 18 will be deflected with respect to the opposite nozzle by a signal stream and consequently the effective portion of the main stream impacting with the opposed stream will be varied. The strength of the stream from orifice 20 is at a maximum in the absence of a signal and as the control signal increases, its strength decreases and the opposed stream from nozzle 19 moves the impact point from the collector chamber and reduces the output signal. Thus, the transverse impact amplifier produces a negative gain.

A transverse impact modulator was constructed and satisfactorily employed with air as the fluid in an operational amplifier having the following pertinent specification:

| | Inches |
|---|---|
| Distance between emitting orifice 21 and control orifice 23 | .005 |
| Distance between emitting orifice 20 and control orifice 23 | .070 |
| Diameter of orifices 20, 21 and 26 | .016 |
| Distance between orifice 26 and center line of orifice 20 | .016 |
| Distance between orifice 20 and center line of orifice 26 | .016 |
| Diameter of orifice 23 | .018 |
| Diameter of orifice 24 and nozzles 18, 19 and 25 (internal) | .092 |

In FIG. 4, a main supply line 27 provides the source of the main streams for each of the stages and each stage is constructed with a unique manifold system, as follows.

A restrictor 28 is connected between the main supply line 7 and to a common input point or hose connection 29. Nozzle 18 is connected directly to that connection 29 and therefore establishes a stream proportional to the supply pressure divided by the drop or fluid impedance of the restrictor 28. The opposite supply nozzle 19 is connected to the common point 29 through a further restrictor 30 to reduce the strength of the corresponding stream by a fixed percentage. Generally, optimum output range is controlled by provision of a given percentage difference. For example, in the above noted transverse impact modulator construction, the pressure of the stream from nozzle 19 for optimum range was of the order of 70 percent. The collector orifice 24 is connected to the input nozzle 25 of the next stage or to the output line 2. The signal nozzle 25 of the first stage is connected to the output of the set point modulator 3.

The set point modulator 3 is an impact amplifier generally constructed in the same manner as shown in FIG. 5, except that the transverse nozzle has been omitted. Modulator 3 thus includes a pair of opposed stream nozzles 31 and 32. The nozzle 32 constitutes the input signal nozzle and is connected in common to a plurality of separate input channels 34 and 35, each of which includes a fixed restrictor 36 and 37, respectively. Nozzle 31 is connected to the main supply line 27 in series with a nonlinear restrictor 38 having adjustable means, shown by arrow 39. The value of the flow impedance to nozzle 31 is adjusted by presetting of the nonlinear restrictor 38 to a suitable level to operate the system at an elevated pressure such that the pressure $\overline{P}_e$ establishes the selected zero output signal. The restrictor 11 is connected between the ouput line 2 and the connection of the restrictors 36 and 37 to the nozzle 32 generally as shown in FIGS. 1 and 4 and sums the signal flows to the nozzle 32. The restrictors in accordance with the laws of continuity and recognized functioning convert the pressure signals to related flows and the total flow at nozzle 32 will be the summation of flows from the static or zero signal error pressure ($\overline{P}_e$) and the changes in such which are the small signal pressure flow ($p_e$) and correspondingly appear at nozzle 32 as shown in FIG. 4. An output collector chamber 40 is provided adjacent nozzle 31 and provides the input to the nozzle 25 of the first amplifying stage 15. The operational amplifier unit is completed by the fixed feedback restrictor, as in FIG. 1.

Figure 6:
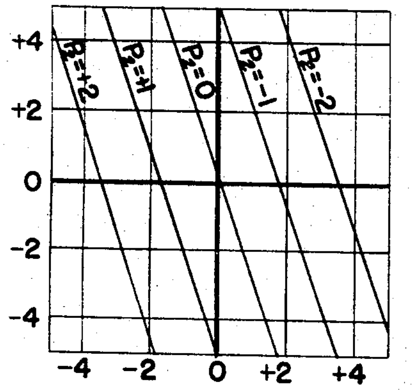
FIG. 6 is a set of curves showing the operation of the circuit shown in FIG. 4.

A double input operational amplifier of the above construction having a set point modulator and a three stage amplifier with a forward gain of approximately $1.7\times10^4$ has been constructed. The impedance ratio of the feedback restrictor and the respective input restrictor were respectively 3 and 5. The operation of the operational amplifier is shown in FIG. 6 with a set of curves for different fixed values of the input signal to the input associated with the impedance ratio of five. The zero lines are in fact at the elevated operating pressure of 5 pounds per square inch gauge pressure. The characteristic clearly illustrates that the gain is determined by the passive elements, the restrictors, and is independent of the active elements in the improved operational amplifier of this invention.

In the summary of the present invention, it provides a pure fluid operational amplifier which has the ability to multiply one or more input signals by the same or different constants and sum the results such that it produces a pure fluid device performing functions similar to electronic operational amplifiers. Further, the operation of the amplifier can reliably and accurately be predicted from design parameters notwithstanding the fact that the high gain fluid amplifier does not have a truly infinite impedance.

Various modes of carrying out the invention are contemplated as being within the scope of the following claims particularly pointing out and distinctly claiming the subject matter which is regarded as the invention.

We claim:

1. In a pure fluid operational amplifier,
   a pure fluid amplifying means having a high negative gain,
   a pure fluid set point impact modulator having an output means connected as a signal source to the amplifying means and having an input means to receive input signals one of which constitutes a set point control,
   a feedback fluid restrictor connecting the output of the amplifying means to the input means of the set point modulator, and
   signal means connected to the input means and including an input fluid restrictor having a selected fluid resistance, whereby the overall gain of the operational amplifier is essentially proportional to the resistance ratio of the feedback fluid restrictor to the input fluid restrictor.

2. The pure fluid operational amplifier of claim 1 wherein the amplifying means operates at an elevated pressure with a positive set point pressure and a corresponding positive output pressure constituting a zero reference whereby the amplifier can operate with both positive and negative fluid signals.

3. In a pure fluid operational amplifier,
   a pure fluid amplifying means having a high negative gain, said fluid amplifying means having a non-infinite fluid input impedance, a pure fluid set point impact modulator having an output means connected as a signal source to the amplifying means and having a pair of input means one of which is adapted to receive a plurality of input signals in parallel and the other of which constitutes a set point control, a set point pressure source having a setpoint restrictor connected to the set point control input means, a feedback fluid restrictor connecting the output of the amplifying means to the first input means of the set point modulator, and a plurality of input signal lines connected to the first input means and each including individual input fluid restrictors having a selected fluid resistance, whereby the overall gain of the operational ampilfier for any given input is essentially proportional to the ratio of the feedback fluid resistance to the input fluid resistance.

4. In a pure fluid operational amplifier, a pure fluid amplifying means having a high negative gain, said fluid amplifying means having a non-infinite fluid input impedance, a pure fluid set point modulator of the impacting stream amplifying type having an output means with an output signal determined by a pair of opposed impacting streams and said output means connected as a signal source to the amplifying means, said modulator having a pair of input means for determining said impacting streams, a set point pressure source connected to the first of the input means, input signal restrictors connected to the second of the input means, and a feedback fluid restrictor connecting the output of the amplifying means to the second of the input means of the set point modulator whereby the overall gain of the operational amplifier for any given input is essentially proportional to the resistance ratio of the feedback fluid restrictor to the corresponding input fluid restrictor.

5. The pure fluid operational amplifier of claim 4 having a variable restrictor connected between the set point pressure source and the first of the input means.

6. The pure fluid operational amplifier of claim 4 wherein the amplifying means is a transverse impacting stream device having a pair of opposed main stream nozzles for forming a pair of opposed impacting main streams with a transverse input nozzle for directing a control stream against a first of the main streams and an output control orifice adjacent the impact point of the main streams, a common pressure supply line, a fluid restrictor connected to the first of the main stream nozzles and to the supply line, and a fluid restrictor connected to the first and the second of the main stream nozzles.

7. In a pure fluid operational amplifier, a pure fluid amplifying means having a negative gain at least of the order of $\times 10^3$, an impact modulator having a pair of opposed stream forming nozzle means one of which is connected to a set point pressure source and the second of which constitutes an input signal means and having a fluid output means connected to the pure fluid amplifying means, a plurality of input signal restrictors connected in parallel to the second nozzle means, and a feedback restrictor connecting the output of the amplifying means to the input of the modulator.

8. In a pure fluid operational amplifier, a set point impact modulator having a set point pressure input means and a signal input means, a pure fluid amplifying means haping a negative gain of sufficient magnitude to provide a feedback source holding the input signal to the set point modulator essentially constant over the entire output range, said set point impact modulator having a fluid output means connected to the pure fluid amplifying means, a plurality of input signal restrictors connected in parallel to the signal input means, a feedback restrictor connecting the output of the amplifying means to the input of the modulator, the output signal of the system being defined by the small signal equation $$p_o = \frac{-\left(\frac{R_f}{R_i}\right) p_i}{1 + \frac{R_f}{K_o}\left(G_t + \frac{1}{r}\right)}$$

wherein $p_o$=the output signal $p_i$=the input signal $R_f$=the fluid impedance of the feedback restrictor $R_i$=the fluid impedance of the input restrictor $K_o$=the gain of the amplifying means $r$=the small signal input impedance of the amplifying means $$G_t = \sum_{i=1}^{n} \frac{1}{R_i} + \frac{1}{R_f}$$

where $n$=number of inputs and the set point pressure being selected to increase the impedance of the amplifier to essentially reduce tht value of the denominator to one such that the system gain is equal essentially to the impedance ratio $R_f/R_i$.

9. In a pure fluid operational amplifier, a pure fluid amplifying means having a negative gain at least of the order of $\times 10^3$, a set point modulator having a pair of opposed stream forming nozzle means one of which is connected to a set point pressure source and the second of which constitutes an input signal means and having a fluid output means connected to the pure fluid amplifying means, a plurality of input signal restrictors connected in parallel to the second nozzle means, a feedback restrictor connecting the output of the amplifying means to the input of the modulator, the output signal of the system being defined by the small signal equation $$p_o = \frac{-\left(\frac{R_f}{R_i}\right) p_i}{1 + \frac{R_f}{K_o}\left(G_t + \frac{1}{r}\right)}$$

wherein $p_o$=the output signal $p_i$=the input signal $R_f$=the fluid impedance of the feedback restrictor $R_i$=the fluid impedance of the input restrictor $K_o$=the gain of the amplifying means $r$=the small signal input impedance of the amplifying means $$G_t = \sum_{i=1}^{n} \frac{1}{R_i} + \frac{1}{R_f}$$

and the set point pressure being selected to increase the impedance to essentially reduce the value of the denominator to one such that the system gain is equal essentially to the impedance ratio $R_f/R_i$.

References Cited

UNITED STATES PATENTS 3,272,215 9/1966 Bjornsen ---------- 137—81.5

M. CARY NELSON, *Primary Examiner.*

W. R. CLINE, *Assistant Examiner.*